(12) United States Patent
Moon

(10) Patent No.: US 7,247,843 B1
(45) Date of Patent: Jul. 24, 2007

(54) LONG-RANGE GAP DETECTION WITH INTERFEROMETRIC SENSITIVITY USING SPATIAL PHASE OF INTERFERENCE PATTERNS

(75) Inventor: Euclid E. Moon, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 11/432,574

(22) Filed: May 11, 2006

(51) Int. Cl.
*G01B 9/02* (2006.01)
*G01B 11/02* (2006.01)

(52) U.S. Cl. .............. 250/237 G; 250/548; 250/559.3; 356/505; 356/509

(58) Field of Classification Search ............ 250/237 G, 250/548, 559.29, 559.3; 356/505, 506, 508, 356/509, 496, 498, 492
See application file for complete search history.

(56) References Cited

U.S. PATENT DOCUMENTS

| | | | |
|---|---|---|---|
| 5,216,257 A * | 6/1993 | Brueck et al. ............. 250/548 |
| 5,414,514 A * | 5/1995 | Smith et al. ............. 356/509 |
| 5,808,742 A * | 9/1998 | Everett et al. ............. 356/509 |
| 6,088,103 A * | 7/2000 | Everett et al. ............. 356/503 |
| 6,522,411 B1 * | 2/2003 | Moon et al. ............. 356/505 |
| 6,855,464 B2 * | 2/2005 | Niu et al. ............. 430/5 |
| 7,181,057 B2 * | 2/2007 | Adel et al. ............. 382/144 |

* cited by examiner

Primary Examiner—John R. Lee
(74) Attorney, Agent, or Firm—Gauthier & Connors LLP

(57) ABSTRACT

An apparatus and method measures the gap between one substantially planar object, such as a mask, and a second planar object, such as a substrate. A gapping mark is used for measuring a gap between the first and second plates. The gapping mark includes a first grating on a first surface of a first plate, the first grating having a first uniform period in a first direction. A second grating is located on the first surface of the first plate, the second grating being adjacent to the first grating in the first direction, the second grating having a second uniform period in the first direction. The gapping mark also includes a third grating on the first surface of the first plate, the third grating being adjacent to the first grating in a second direction, the second direction being substantially orthogonal to the first direction, the third grating having the second uniform period in the first direction. A fourth grating is located on the first surface of the first plate, the fourth grating being adjacent to the third grating in the first direction.

7 Claims, 10 Drawing Sheets

LONG-RANGE GAP DETECTION WITH INTERFEROMETRIC SENSITIVITY USING SPATIAL PHASE OF INTERFERENCE PATTERNS

FIELD OF THE PRESENT INVENTION

The present invention is directed to a gapping measurement technique referred to as Long-Range Interferometric Gapping. More particularly, the present invention is directed to a gapping measurement technique that encodes a gap in the spatial phase relation between adjacent sets of interference fringes.

BACKGROUND OF THE PRESENT INVENTION

Lithography is conventionally performed by a variety of systems and methods. Optical projection lithography employs a mask which is then imaged onto a substrate using either refractive or reflective optics, or a combination of the two. The mask contains the pattern to be created on the substrate, or a representation thereof.

FIG. 1 illustrates a cross sectional view of a conventional lithographic mask 10 separated from substrate 20 by a small gap, G. The mask 10 includes a support frame 11, membrane 12, and alignment marks 13. Complementary alignment marks 21 are located on the substrate and face the mask alignment marks 13.

FIG. 2 illustrates a prior art mask 10, showing four alignment marks 13. The central region of mask 10 includes pattern region 14 that contains the pattern that is to be superimposed over a pattern on the substrate.

FIG. 3 illustrates a substrate containing multiple identical regions of patterns 22 over which mask pattern 14 is to be superimposed in a sequence of three steps: (1) move to one of the multiple sites; (2) align mask alignment marks with respect to substrate alignments marks; (3) expose mask pattern 14 on top of substrate pattern 22.

Visible or near-infrared light is preferably used as the illuminating source for alignment, spanning a wavelength band from 400 to 900 nm, but other wavelengths may also be used. The light must be collimated with good spatial coherence. In addition, it is necessary that grating periods exceed wavelengths used in the illuminating bandwidth, so that first order diffraction is possible. The first order diffraction angle is $\sin\theta = \lambda/g$ where $\theta$ is the diffraction angle, $\lambda$ is the wavelength, and g is the period. Hence, first-order diffraction with $\lambda/g > 1$ is not possible. It is desirable that grating periods exceed twice the value of any wavelengths used in the illuminating bandwidth, to ensure that first order diffraction occurs at an angle of no more than 30 degrees. Preferably, the alignment marks should include 10 or more periods of each of the paired gratings.

FIG. 4 illustrates a prior art arrangement of pairs of complementary alignment marks with differing periods to increase the range of freedom from measuring ambiguity. This feature increases the range of misalignment that can be measured without ambiguity, or increases the capture range.

In one arrangement the substrate alignment mark 21 includes two simple linear gratings having different spatial periods, $g_{s1}$ and $g_{s2}$. The mask alignment mark 13 includes two simple linear gratings having different spatial periods, $g_{m1}$ and $g_{m2}$. In between the gratings $g_{s1}$ and $g_{s2}$, or between the gratings $g_{m1}$ and $g_{m2}$ (latter is shown in FIG. 4) is an unpaired reference grating having a period $g_r$ which is coarser than any of $g_{m1}$, $g_{m2}$, $g_{m1}$, and $g_{m2}$. The periods $g_r$, $g_{m1}$, $g_{m2}$, $g_{m1}$, and $g_{m2}$ are chosen so that:

$$g_r = g_{s1} * g_{m1}/|g_{s1} - g_{m1}| = g_{s2} * g_{m2}/|g_{s2} - g_{m2}|$$

This relationship ensures that $g_r$ is also the period of the two interference fringe patterns formed by the overlap of beams diffracted by the gratings. One such pattern results from interference of beams diffracted by gratings $g_{s1}$ and $g_{m1}$. The second such pattern results from interference of beams diffracted by gratings $g_{s2}$ and $g_{m2}$.

FIG. 5 illustrates the viewing of the pairs of facing alignment marks 21 and 13 by a microscope. Alignment occurs upon attainment of a predetermined phase difference. For example, this phase difference could be zero, in which case the microscope image would appear as in FIG. 6 when alignment occurs. When the relative mask and substrate positions are slowly changed, the fringe patterns will translate at higher rates. This translation not only results in magnification of the relative motion, but also overcomes the ambiguity problem that would arise with only one grating pair when the relative motion is a multiple of a grating period.

FIG. 6 illustrates the interference fringe patterns, and the reference pattern, observed when the alignment marks of FIG. 4 are properly superimposed. FIG. 7 illustrates an example of how the fringe patterns of FIG. 6 are shifted relative to each other when mask and substrate are relatively displaced perpendicular to the lines of the grating pairs.

In zone plate array lithography, an array of Fresnel zone plates is placed one focal distance away from the substrate. Each Fresnel zone plate can be individually addressed by a spatial light modulator to create an arbitrary dot-illumination matrix.

Further examples of systems using interference fringe patterns for interferometric detection of alignment and small gaps are described in U.S. Pat. No. 5,414,514; U.S. Pat. No. 6,088,103; and U.S. Pat. No. 6,522,411. The entire contents of U.S. Pat. No. 5,414,514; U.S. Pat. No. 6,088,103; and U.S. Pat. No. 6,522,411 are hereby incorporated by reference.

In the various lithographic methods discussed above, in which a pattern on a mask or template is transferred to a second planar surface, such as a silicon wafer or substrate, it is necessary to arrange the two surfaces so that the two surfaces are highly parallel, prior to bringing the two surfaces into close proximity or contact. A high degree of parallelism is important for control of consistent feature sizes and to avoid destructive contact between the template and substrate. In other applications, the surfaces may be required to be held at a specific angle or a specific large gap.

Conventionally, capacitive sensors have been used for gap detection in nano-positioning systems to detect gaps of <100 µm. Detectivity scales with the gap range—for a gap range of 10 µm, detectivity can be <1 nm. Moreover, conventionally, for a capacitive sensor designed for a gap range of 500 µm, detectivity is only ~50 nm.

In a mask-substrate aligner, capacitive sensors are typically used to measure gap at three points around the periphery of the mask stage. Since the capacitive sensors measure the mask-substrate gap indirectly, calibration of the capacitive measurements to the actual mask-substrate gap is required. Errors associated with this methodology include thermal drift, variations between dimensions of individual masks, and stress-induced deformation by the mask stage.

Capacitive sensors have also been embedded within part of the substrate stage, adjacent to the substrate, and scanned underneath the mask. Some problems with this conventional embodiment are the potential mismatch between the capacitive sensing plane and the substrate plane, the time required to move the sensor and measure gap at multiple points, and perturbations in the capacitive measurements caused by patterned regions on the mask.

Aside from the various problems discussed above, the intrinsic limitations of capacitive sensors lie in the tradeoff between range and resolution because the capacitance falls off linearly with gap, G, between the plates, as illustrated by the following:

$$C = \frac{\varepsilon_r \varepsilon_o A_p}{G}$$

wherein $\varepsilon_r$ is the relative permittivity of the material between the plates, $\varepsilon_o$ is the permittivity of vacuum, and $A_p$ is the area of the plates.

At large gaps, electronic noise dominates and limits gap range. At small gaps, noise is reduced, but sensitivity to non-parallelism of the capacitor plates is increased. In combination, these effects serve to limit the useful operating range.

In some applications, such as scanning probes, capacitive sensors are used to find the probe position in six axes, requiring six separate sensors. Since the range of capacitive sensors is very small compared to the diameter of the plates and the points of measurement are separated from each other and the scanning probe by a few centimeters, thermal expansion of the intervening lengths of material can degrade measurement accuracy.

Furthermore, in a multi-axis capacitor arrangement, the area of capacitor plate overlap will come into play during orthogonal motions; as one axis in an XY stage is moved, the area of plate overlap in the orthogonal axis will decrease, and may cause an undesirable variation in capacitance along the orthogonal axis. Measurement error at a point of interest between the two planar surfaces will result.

Another method of conventional gap sensing utilizes optical methods to provide a direct measurement between the mask and substrate. One such conventional method utilizes the interference of beams reflected from a HeNe laser focused onto the mask at an oblique angle. The diverging reflections from the mask and substrate interfered, and the interference fringes are detected by a linear photo-detector array. The gap is determined by the spatial frequency of the interference pattern, which increases with gap linearly (to first order), with a small gap-dependent deviation from linearity. The range of gap detection is between 25 and 120 μm, and the gap uncertainty is a percentage of gap, ranging between 120 nm and 600 nm.

In proximity lithography, a typical exposure gap (i.e., <5 μm) is below the minimum detection range in the above-described optical method. At such small gaps, the angular disparity between reflected beams is too small to produce measurable interference fringes. Also, the finite thickness of the template causes multiple spurious internal reflections, which can corrupt the measurement signal.

It is further noted that the above-described conventional optical gap sensing method fails to integrate well with Interferometric Spatial-Phase Imaging aligning schemes, such as described in U.S. Pat. No. 5,414,514 and U.S. Pat. No. 6,088,103, since the above-described conventional optical gap sensing method requires diverging illumination, instead of the collimated illumination used in Interferometric Spatial-Phase Imaging. In addition, the geometry of the above-described conventional optical gap sensing method is incompatible with Interferometric Spatial-Phase Imaging alignment microscopes since the above-described conventional optical gap sensing method requires a different illumination angle and a separate sensor that must be on the opposite side of the mask from the illumination.

A second conventional optical gap sensing method measures a gap based on the interference of diffracted beams, using a beat signal that is dependent upon interference of a first-order beam and a second-order beam, diffracted from a grating. Each order has a different diffraction angle, which also depends upon the laser frequency: a laser beam of frequency $f_1$ is incident at an angle $\theta_1$, and another beam with frequency $f_2$ is incident at an angle $\theta_3$. The two orders are arranged to diffract at the same angle, $\theta_2$. The gap is linearly related to the phase of the beat signal. Gap sensitivity is ~32 nm.

Although this second conventional optical gap sensing method can detect small gaps used in proximity exposures, the inseparability of gap and alignment signals is significant and undesirable.

Therefore, it is desirable to provide a method of directly measuring the gap. Moreover, it is desirable to provide an optical method of directly measuring the gap that does not require a different illumination angle and a separate sensor on the opposite side of the mask from the illumination. Also, it is desirable to provide an optical method of directly measuring the gap that can operate with collimated illumination. Furthermore, it is desirable to provide an optical method of directly measuring the gap that has separable gap and alignment signals.

SUMMARY OF THE PRESENT INVENTION

One aspect of the present invention is a gapping mark used for measuring a gap between first and second plates. The gapping mark includes a first grating on a first surface of a first plate, the first grating having a first uniform period in a first direction; a second grating on the first surface of the first plate, the second grating being adjacent to the first grating in the first direction, the second grating having a second uniform period in the first direction; a third grating on the first surface of the first plate, the third grating being adjacent to the first grating in a second direction, the second direction being substantially orthogonal to the first direction, the third grating having the second uniform period in the first direction; and a fourth grating on the first surface of the first plate, the fourth grating being adjacent to the third grating in the first direction, the fourth grating having the first uniform period in the first direction.

Another aspect of the present invention is an apparatus for measuring a gap between first and second plates. The apparatus includes a first plate and a second plate wherein the first plate has a gapping mark on a first surface of the first plate. The gapping mark includes a first grating on the first surface of the first plate, the first grating having a first uniform period in a first direction; a second grating on the first surface of the first plate, the second grating being adjacent to the first grating in the first direction, the second grating having a second uniform period in the first direction; a third grating on the first surface of the first plate, the third grating being adjacent to the first grating in a second direction, the second direction being substantially orthogonal to the first direction, the third grating having the second uniform period in the first direction; and a fourth grating on the first surface of the first plate, the fourth grating being adjacent to the third grating in the first direction, the fourth grating having the first uniform period in the first direction. The apparatus further includes a light source for illuminating a second surface of the second plate through the gapping mark on the first plate to produce an interference pattern and a detector to measure spatial phases of the interference pattern, the spatial phases of the interference pattern corresponding to a gap between the first and second surfaces of the first and second plates.

Another aspect of the present invention is a lithographic mask. The lithographic mask includes a gapping mark on a first surface of the lithographic mask. The gapping mark includes a first grating on the first surface of the lithographic mask, the first grating having a first uniform period in a first direction; a second grating on the first surface of the lithographic mask, the second grating being adjacent to the first grating in the first direction, the second grating having a second uniform period in the first direction; a third grating on the first surface of the lithographic mask, the third grating being adjacent to the first grating in a second direction, the second direction being substantially orthogonal to the first direction, the third grating having the second uniform period in the first direction; and a fourth grating on the first surface of the lithographic mask, the fourth grating being adjacent to the third grating in the first direction, the fourth grating having the first uniform period in the first direction.

Another aspect of the present invention is a method of measuring the gap between first and second plates. The method provides a gapping mark on a first surface of the first plate, the gapping mark including a first grating on the first surface of the first plate, the first grating having a first uniform period in a first direction, a second grating on the first surface of the first plate, the second grating being adjacent to the first grating in the first direction, the second grating having a second uniform period in the first direction, a third grating on the first surface of the first plate, the third grating being adjacent to the first grating in a second direction, the second direction being substantially orthogonal to the first direction, the third grating having the second uniform period in the first direction, and a fourth grating on the first surface of the first plate, the fourth grating being adjacent to the third grating in the first direction; illuminates a second surface of the second plate through the gapping mark on the first plate to produce an interference pattern; measures a phase of the interference pattern; and determines a gap between the first and second surfaces from the measured phase of the interference pattern.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
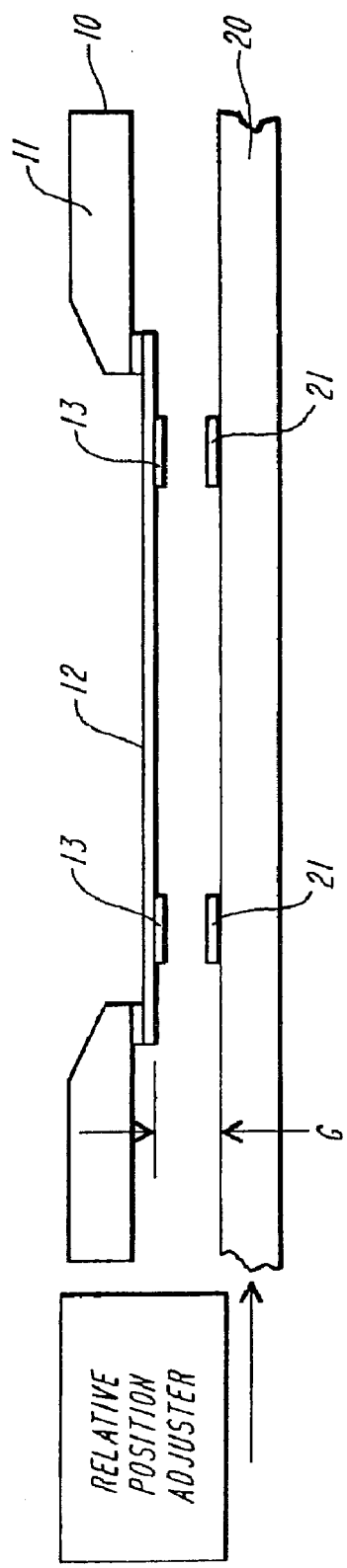
FIG. 1 is a cross-sectional view of a mask and substrate.
Figure 2:
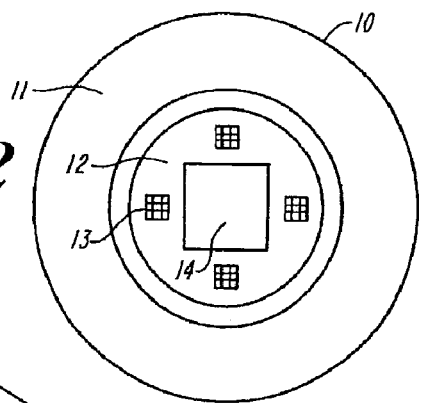
FIG. 2 is a plan view of the mask showing alignment marks.
Figure 3:
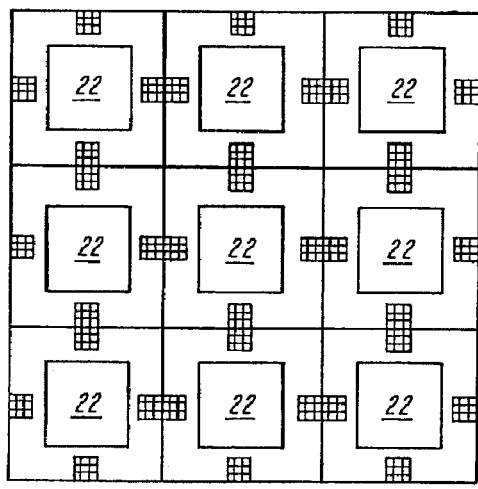
FIG. 3 is a plan view of the substrate showing multiple identical regions to be exposed.
Figure 4:
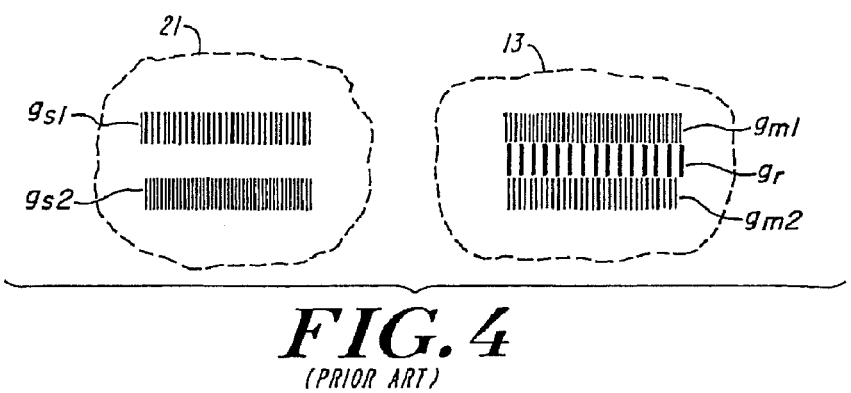
FIG. 4 illustrates one form of complementary alignment marks.
Figure 5:
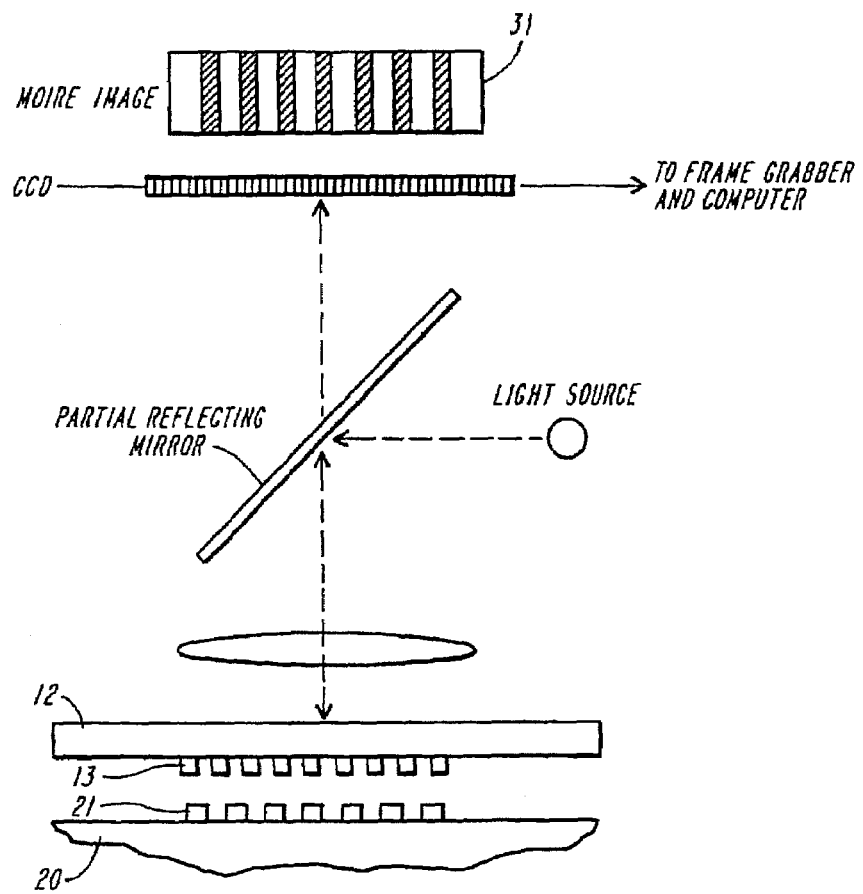
FIG. 5 schematically illustrates viewing alignment marks with a microscope.
Figure 6:
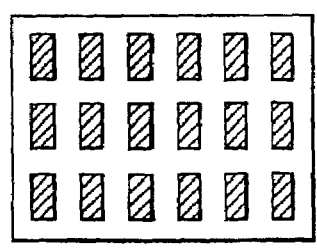
FIG. 6 illustrates the image when the alignment marks of FIG. 4 are superimposed.
Figure 7:
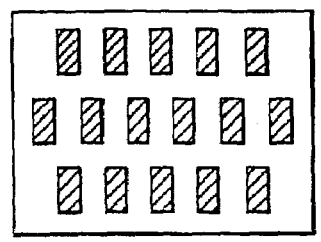
FIG. 7 illustrates the image of FIG. 6 when mask and substrate are misaligned.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, it is desirable to provide a method of directly measuring the gap. Moreover, it is desirable to provide an optical method of directly measuring the gap that does not require a different illumination angle and a separate sensor on the opposite side of the mask from the illumination. Also, it is desirable to provide an optical method of directly measuring the gap that can operate with collimated illumination. Furthermore, it is desirable to provide an optical method of directly measuring the gap that has separable gap and alignment signals.

To realize such a system, the present invention utilizes a method and apparatus that achieves interferometric (<1 nm) sensitivity at large separations of two surfaces by using the relative spatial phase of interference fringe patterns, produced by linear gratings only on one of the surfaces and observed by an inclined-incidence optical microscope. Moreover, the present invention can be used in combination with conventional lithographic systems for interferometric detection of alignment and small gaps; i.e., complete six-axis position detection over large separation between the plates.

As noted above, the present invention utilizes a gapping measurement technique referred to as Long-Range Interferometric Gapping. In this technique, the present invention utilizes the encoding of gap in the spatial phase relation between adjacent sets of interference fringes. The fringes are created by interference of a back-diffracted beam from a first grating with the reflection of a forward-diffracted beam, having a same order as the back-diffracted beam, from a second grating of a slightly different grating period.

Figure 8:
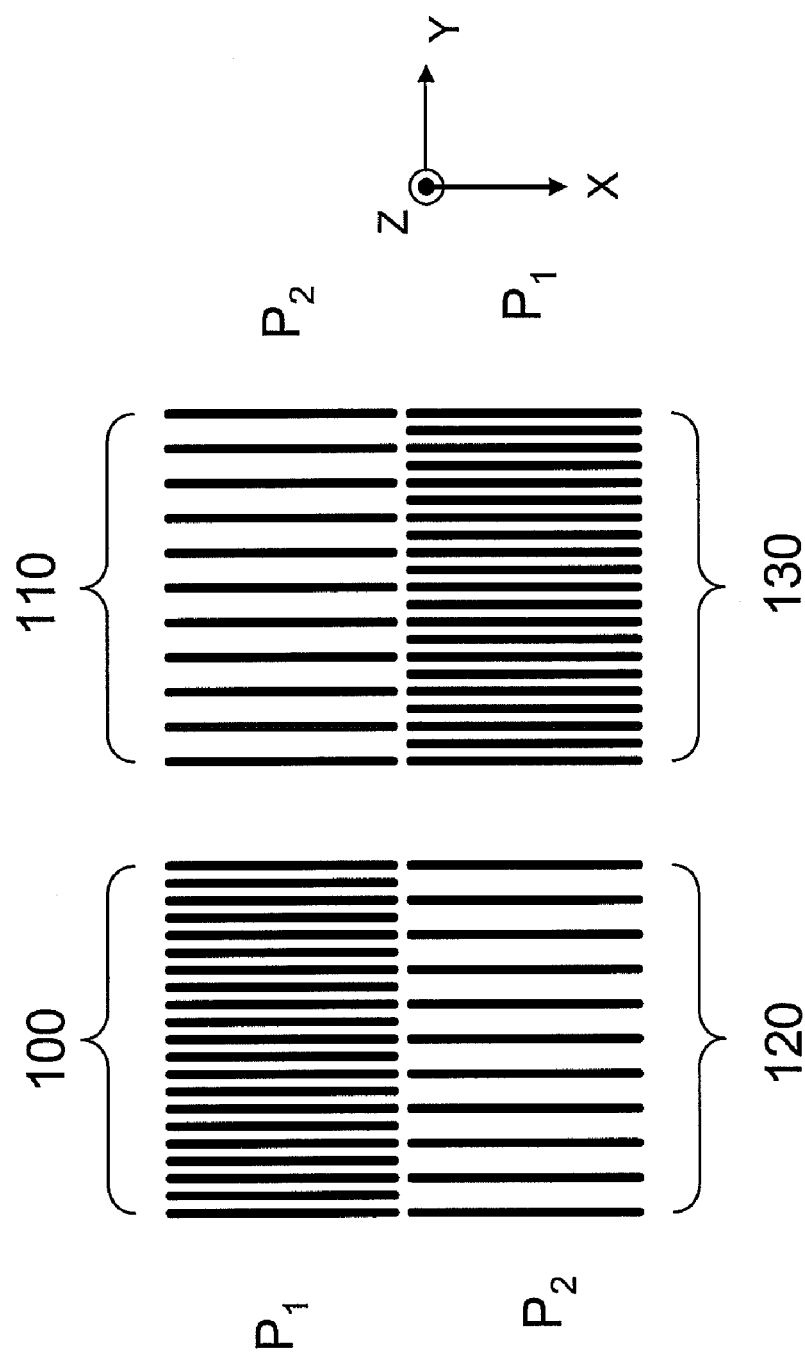
FIG. 8 illustrates a pattern layout for a Long-Range Interferometric Gapping mark according to the concepts of the present invention.

FIG. 8 illustrates a set of Long-Range Interferometric Gapping marks. The Long-Range Interferometric Gapping marks consist of a first constant-period grating 100, having a period of $P_1$, separated from a second constant-period grating 110, having a period of $P_2$, adjacent to a third constant-period grating 120, having a period of $P_2$, separated from a fourth constant-period grating 130, having a period of $P_1$. It is noted that the third and fourth gratings (120 and 130) consist of periods in the reverse order from the first and second gratings (100 and 110).

The gratings may be of either phase or amplitude type. All gratings are on the template surface; no marks are required on the substrate. The gratings are arranged with the k-vectors of one {$P_1$, $P_2$} pair parallel to the Y-axis. In the preferred Long-Range Interferometric Gapping embodiment, both $P_1$ and $P_2$ are similar; e.g., $P_1$=1.000 µm and $P_2$=1.025 µm.

Figure 9:
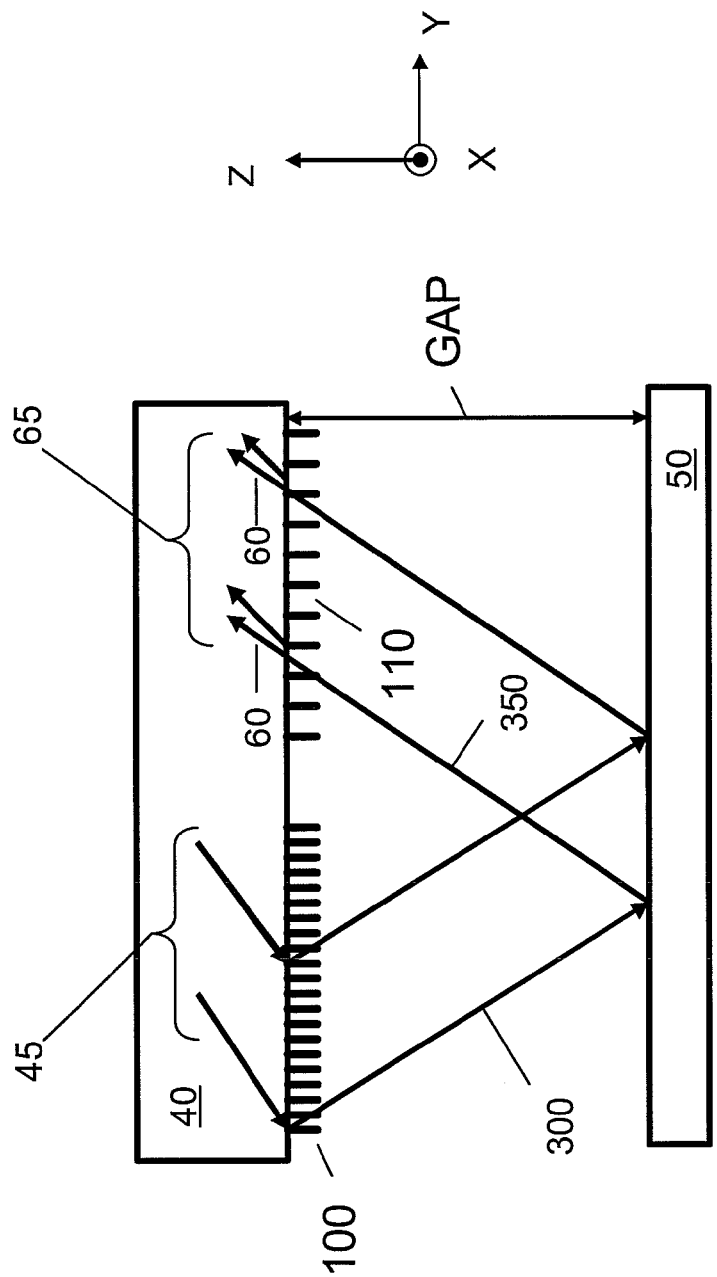
FIG. 9 illustrates a set of beam paths for diffracted beams along one pair of gratings in the pattern layout for a Long-Range Interferometric Gapping mark of FIG. 8.

FIG. 9 illustrates a diagram of diffracted beams along one pair of gratings in the Long-Range Interferometric Gapping scheme of the present invention. Interference of a reflected, forward-diffracted beam from a grating 100 having a period of $P_1$ with a back-diffracted beam from a slightly different grating 110 having a period of $P_2$ results in a set of interference fringes that can be viewed with an optical microscope at an inclined angle.

FIG. 9 further illustrates the geometry of the illumination and diffracted beam paths. Illumination 45 is incident upon (at an inclined angle, i.e., near the Littrow angle, $\theta_L$=a sin($\lambda$/(2p)), where $\lambda$ is the wavelength of illumination, and p is the grating period) a first substrate (mask) 40 having gratings 100 and 110, having a period of $P_1$ and $P_2$, respectively. The beams 300 that forward-diffract in first-order from the grating 100 will reflect (350) from the substrate 50, and within a range of gaps, will intercept all, or a portion of, the grating 110. At the grating 110, diffracted/reflected beams from grating 100 overlap and interfere with back-diffracted beams 60 from the grating 110. Since the periods of gratings 100 and 110 are approximately equal, $P_1 \approx P_2$, the propagation directions of the diffracted beams are sufficiently similar to be imaged by an inclined-incidence, low-NA microscope, as used for Interferometric Spatial-Phase Imaging.

The interference of the diffracted beams 65 creates a periodic pattern with a fringe period given by $P_F = \lambda/(2 \sin \theta_B)$, where $\lambda$ is the wavelength of illumination and $\theta_B$ is the angle between beams of the same order, diffracted by of gratings having periods $P_1$ and $P_2$, respectively. The angles of diffraction are given by $\theta$=a sin(m$\lambda$/p+sin $\theta_{incident}$), where m is the order of diffraction, $\lambda$ is the wavelength of illumination, and $\theta_{incident}$ is the angle of illumination. Thus, the present invention can be used with diffraction of first orders or higher orders.

Figure 12:
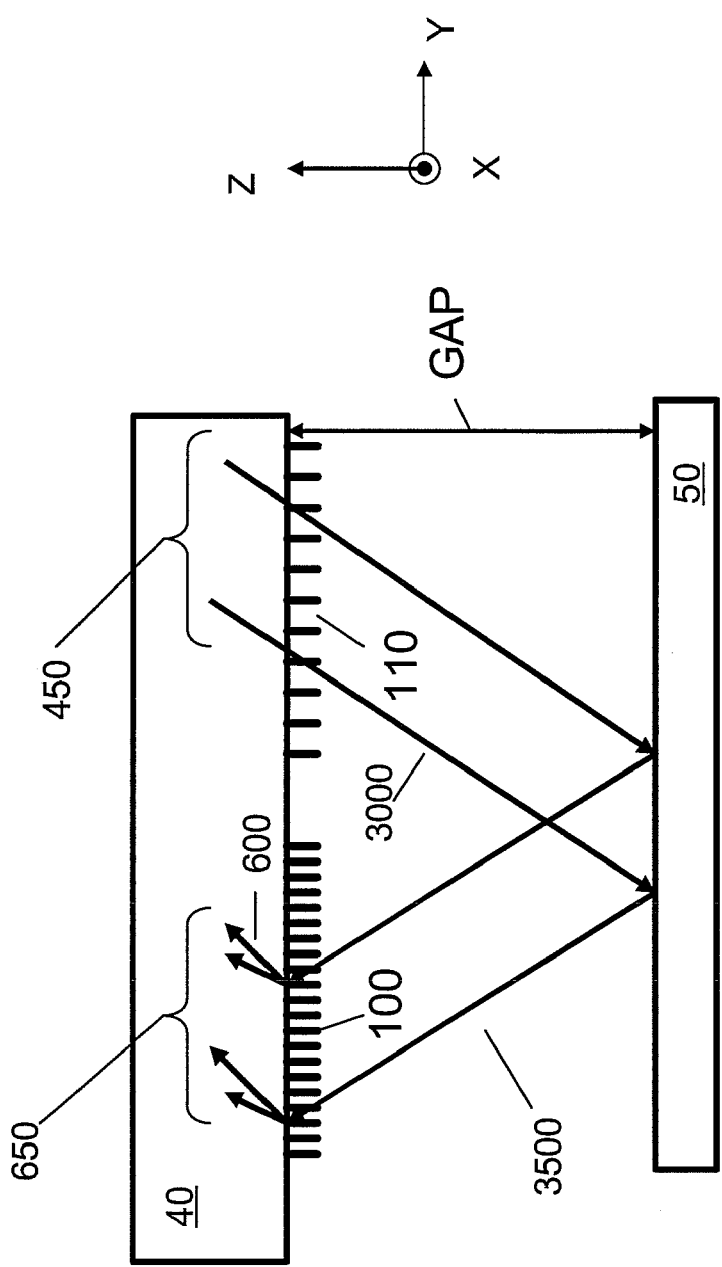
FIG. 12 illustrates another set of beam paths for diffracted beams along one pair of gratings in the pattern layout for a Long-Range Interferometric Gapping mark of FIG. 8.

In the preferred embodiment, the diffraction uses interference of +/−$1^{st}$ order diffracted beams and can realize a gap sensitivity of ~0.2 nm. It is noted that the spatial phase of the fringes varies with gap, while the period of the fringes is independent of gap FIG. 12 illustrates a diagram of another set of diffracted beams along one pair of gratings in the Long-Range Interferometric Gapping scheme of the present invention. Interference of a reflected, forward-diffracted beam from a grating 110 having a period of $P_2$ with a back-diffracted beam from a slightly different grating 100 having a period of $P_1$ results in a set of interference fringes that can be viewed with an optical microscope at an inclined angle.

FIG. 12 further illustrates the geometry of the illumination and diffracted beam paths. Illumination 450 is incident upon (at an inclined angle, i.e., near the Littrow angle, $\theta_L$=a sin($\lambda$/(2p)), where $\lambda$ is the wavelength of illumination, and p is the grating period) a first substrate (mask) 40 having gratings 100 and 110, having a period of $P_1$ and $P_2$, respectively. The beams 3000 that forward-diffract in zero-order from the grating 110 will reflect (3500) from the substrate 50, and within a range of gaps, will intercept all, or a portion of, the grating 100. At the grating 100, reflected beams 3500 from the substrate 50 diffract in first order and interfere with back-diffracted beams 600 from the grating 100. Since the periods of gratings 100 and 110 are approximately equal, $P_1 \approx P_2$, the propagation directions of the diffracted beams are sufficiently similar to be imaged by an inclined-incidence, low-NA microscope, as used for Interferometric Spatial-Phase Imaging.

The interference of the diffracted beams 650 creates a periodic pattern with a fringe period given by $P_F = \lambda/(2 \sin \theta_B)$, where $\lambda$ is the wavelength of illumination and $\theta_B$ is the angle between beams of the same order, diffracted by of gratings having periods $P_1$ and $P_2$, respectively. The angles of diffraction are given by $\theta$=a sin(m$\lambda$/p+sin $\theta_{incident}$), where m is the order of diffraction, $\lambda$ is the wavelength of illumination, and $\theta_{incident}$ is the angle of illumination. Thus, the present invention can be used with diffraction of first orders or higher orders.

In the preferred embodiment, the diffraction uses interference of +/−$1^{st}$ order diffracted beams and can realize a gap sensitivity of ~0.2 nm. It is noted that the spatial phase of the fringes varies with gap, while the period of the fringes is independent of gap.

Figure 13:
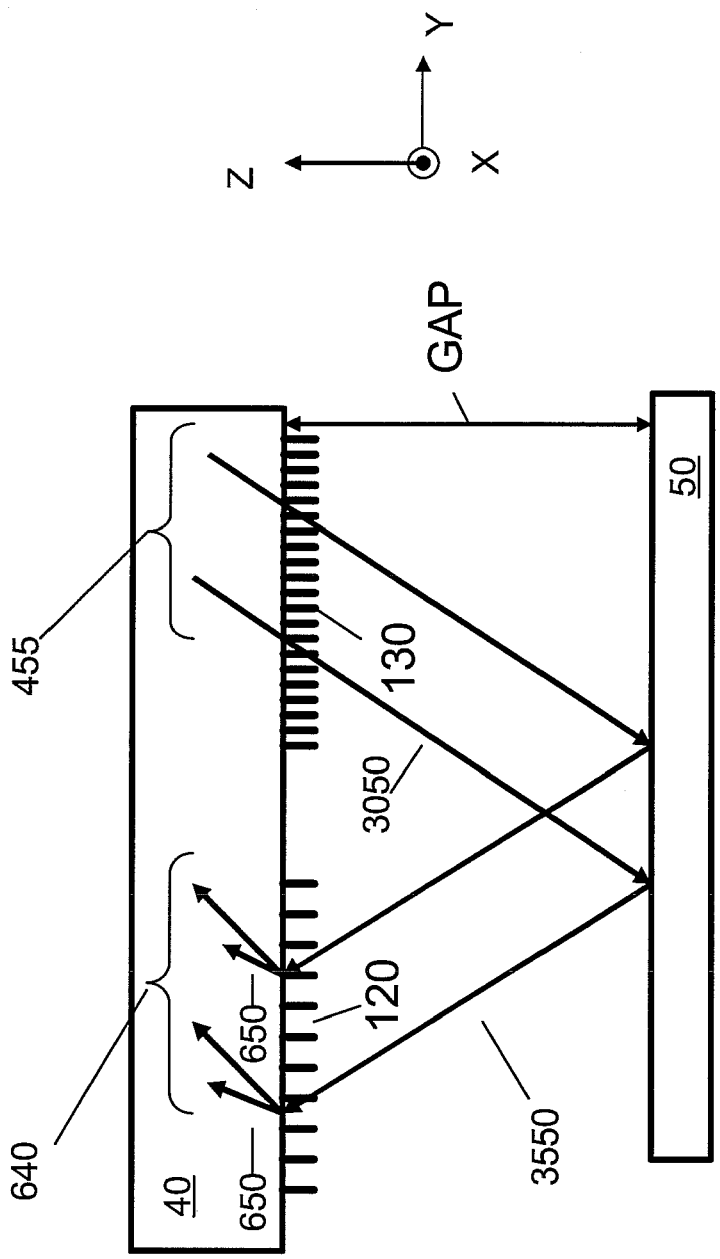
FIG. 13 illustrates a third set of beam paths for diffracted beams along one pair of gratings in the pattern layout for a Long-Range Interferometric Gapping mark of FIG. 8.

FIG. 13 further illustrates another example of the geometry of the illumination and diffracted beam paths. Illumination 455 is incident upon (at an inclined angle, i.e., near the Littrow angle, $\theta_L$=a sin($\lambda$/(2p)), where $\lambda$ is the wavelength of illumination, and p is the grating period) a first substrate (mask) 40 having gratings 120 and 130, having a period of $P_2$ and $P_1$, respectively. The beams 3050 that forward-diffract in zero-order from the grating 130 will reflect (3550) from the substrate 50, and within a range of gaps, will intercept all or a portion of the grating 120. At the grating 120, reflected beams 3550 from the substrate 50 diffract in first order and interfere with back-diffracted beams 650 from the grating 120. Since the periods of gratings 130 and 120 are approximately equal, $P_1 \approx P_2$, the propagation directions of the diffracted beams are sufficiently similar to be imaged by an inclined-incidence, low-NA microscope, as used for Interferometric Spatial-Phase Imaging.

The interference of the diffracted beams 640 creates a periodic pattern with a fringe period given by $P_F = \lambda/(2 \sin \theta_B)$, where $\lambda$ is the wavelength of illumination and $\theta_B$ is the angle between beams of the same order, diffracted by of gratings having periods $P_2$ and $P_1$, respectively. The angles of diffraction are given by $\theta$=a sin(m$\lambda$/p+sin $\theta_{incident}$), where m is the order of diffraction, $\lambda$ is the wavelength of illumination, and $\theta_{incident}$ is the angle of illumination. Thus, the present invention can be used with diffraction of first orders or higher orders.

Figure 14:
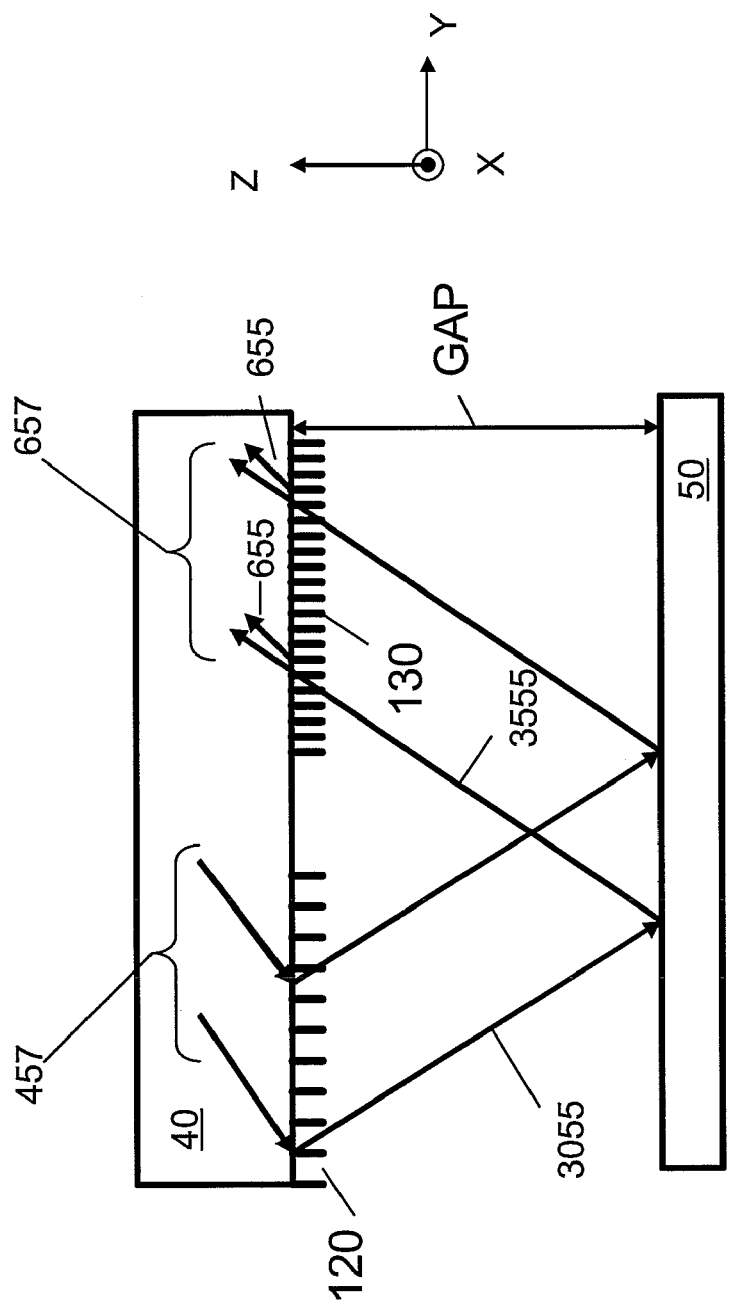
FIG. 14 illustrates a fourth set of beam paths for diffracted beams along one pair of gratings in the pattern layout for a Long-Range Interferometric Gapping mark of FIG. 8.

In the preferred embodiment, the diffraction uses interference of +/−$1^{st}$ order diffracted beams and can realize a gap sensitivity of ~0.2 nm. It is noted that the spatial phase of the fringes varies with gap, while the period of the fringes is independent of gap FIG. 14 illustrates a diagram of another set of diffracted beams along one pair of gratings in the Long-Range Interferometric Gapping scheme of the present invention. Interference of a reflected, forward-diffracted beam from a grating 120 having a period of $P_2$ with a back-diffracted beam from a slightly different grating 130 having a period of $P_1$ results in a set of interference fringes that can be viewed with an optical microscope at an inclined angle.

FIG. 14 further illustrates the geometry of the illumination and diffracted beam paths. Illumination 457 is incident upon (at an inclined angle, i.e., near the Littrow angle, $\theta_L$=a sin($\lambda$/(2p)), where $\lambda$ is the wavelength of illumination, and p is the grating period) a first substrate (mask) 40 having gratings 130 and 120, having a period of $P_1$ and $P_2$, respectively. The beams 3055 that forward-diffract in first-order from the grating 120 will reflect (3555) from the substrate 50, and within a range of gaps, will intercept all or a portion of the grating 130. At the grating 130, diffracted/reflected beams from grating 120 overlap and interfere with back-diffracted beams 655 from the grating 130. Since the periods of gratings 130 and 120 are approximately equal, $P_1 \neq P_2$, the propagation directions of the diffracted beams are sufficiently similar to be imaged by an inclined-incidence, low-NA microscope, as used for Interferometric Spatial-Phase Imaging.

The interference of the diffracted beams 655 creates a periodic pattern with a fringe period given by $P_F = \lambda/(2 \sin \theta_B)$, where $\lambda$ is the wavelength of illumination and $\theta_B$ is the angle between beams of the same order, diffracted by of gratings having periods $P_2$ and $P_1$, respectively. The angles of diffraction are given by $\theta$=a sin(m$\lambda$/p+sin $\theta_{incident}$), where m is the order of diffraction, $\lambda$ is the wavelength of illumination, and $\theta_{incident}$ is the angle of illumination. Thus, the present invention can be used with diffraction of first orders or higher orders.

In the preferred embodiment, the diffraction uses interference of +/−$1^{st}$ order diffracted beams and can realize a gap sensitivity of ~0.2 nm. It is noted that the spatial phase of the fringes varies with gap, while the period of the fringes is independent of gap.

In the various embodiments described above with respect to FIGS. 9, 12, 13, and 14, the spatial phase varies with gap due to dependence of points of constructive interference upon the path length in one arm of an interferometer; i.e., the arm that includes the gap. The reference arm, containing the back-diffracted beam, moves with the planar surface.

As noted above, the drawings may not be to scale. Thus, it is noted for FIGS. 9, 12, 13, and 14 that the angles between back-diffracted and reflected/diffracted beams should be the same in all cases. It is further noted that the back-diffracted component switches places, having the smaller of the two angles with respect to the normal of the surface when the associated grating period is larger; i.e., in FIG. 9 grating 110 has period $P_2$, which is 1.025 micron, the larger of the two periods ($P_1$=1.000 micron); hence the back-diffracted beam has the smaller of the two angles. It is assumed that the back-diffraction angles for each grating are at symmetric angles around the illumination angle.

Furthermore, it is noted that is that there is a back-diffracted component from each grating that interferes with a reflected/diffracted component from the separated grating. The angles of these components are interchanged when looking at adjacent fringe sets, causing motion of the fringes in opposite directions, but the fringe period is the same.

A change in gap alters the path-length difference in the forward diffracted/reflected beam path, resulting in phase differences along the wavefront that impinge upon the first grating. The differences in the phase along the inclined grating (with respect to the incident wavefront of the diffracted/reflected beam) cause a shift in the points of constructive interference in the fringe pattern. The direction of the phase shift depends upon the arrangement of the grating periods. Interchanging the grating periods reverses the direction of the phase shift.

As noted above, gap is encoded in the spatial phase between two sets of fringes. The spatial phase relation of the fringes is determined in a same manner, using the same algorithm, as the spatial phase relation of alignment fringes in an Interferometric Spatial-Phase Imaging system; i.e., by finding the phase value corresponding to the frequency fundamental in a cross-power spectrum algorithm.

The inclined imaging configuration of the present invention reduces scattered light, and hence noise, in the image. This optical configuration uses a special type of darkfield imaging, in that no light returns to the microscope except that which is diffracted back from specific periodic structures on a sample surface.

Moreover, with respect to the present invention, the fringes remain in focus over gap ranges of several millimeters, or more, as limited by the spatial coherence of the incident laser beam, not by the focal length of the microscope. The upper range is constrained by the coherence length of the laser, the dimensions and separation of the gratings, and the field of view of the microscope. The lower range is constrained by the amount of overlap of a $P_1$-period grating with the diffracted beams from a $P_2$-period grating, or vice versa.

In the present invention, a single set of fringes cycles through one period during a change in gap equal to the wavelength of illumination, $\lambda$. Opposite motion of a fringe pair results in one relative phase cycle in a gap change of $\lambda/2$.

For example, if a diode laser illumination is used at 660 nm, a $2\pi$ phase change between the fringes indicates a 330 nm gap change. Fourier-domain analysis of the relative phase between the fringe sets yields detection to <1/4000 of a phase cycle, resulting in gap detectivity ~0.2 nm. Such high gap sensitivity, which can be measured at multiple points between the surfaces, indicates that a template can be leveled with very high precision, as is required in various forms of imprint lithography. The same phase relationship between the fringe sets is repeated for every gap change by $\lambda/2$ $\mu$m.

In a preferred embodiment of the present invention, phase ambiguity of the fringes is eliminated by placing a diffraction grating with periodic interruptions adjacent to the Long-Range Interferometric Gapping marks. The interrupted grating mark and Long-Range Interferometric Gapping mark are observed with the same microscope, in the same field of view. Phase ambiguity of the Long-Range Interferometric Gapping mark is removed by measurement of the spatial phase between two sets of beams diffracted from the interrupted grating.

Figure 10:
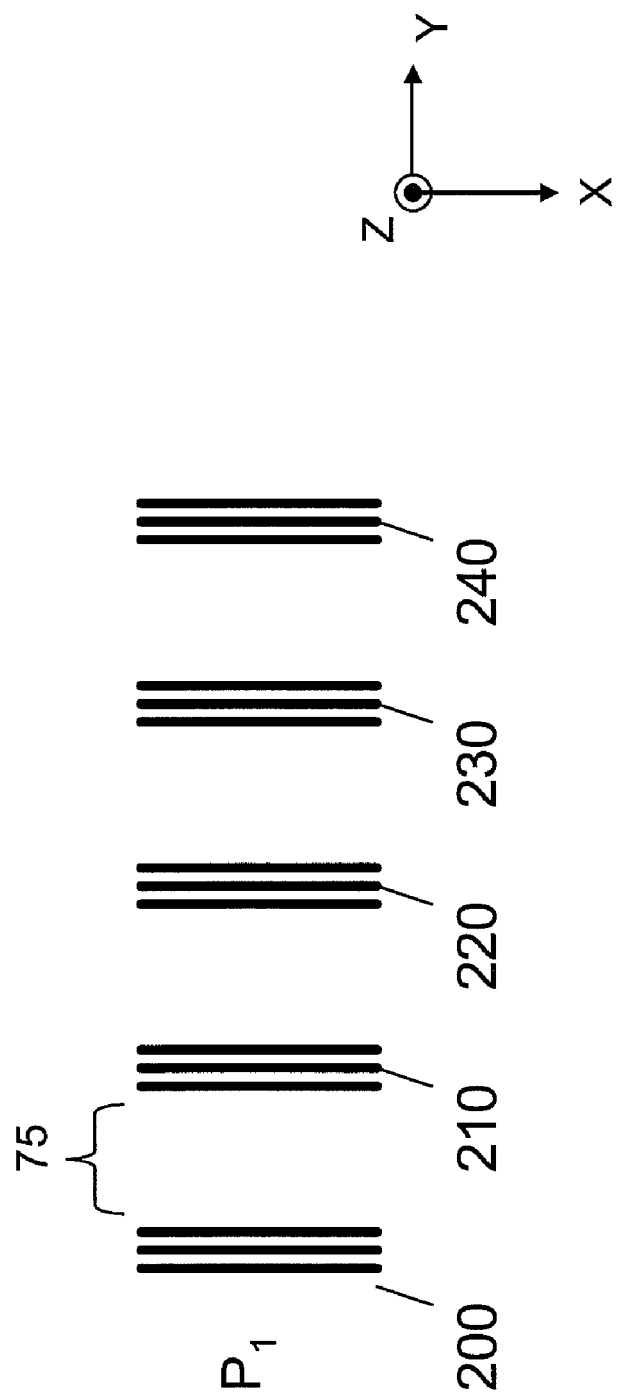
FIG. 10 illustrates an interrupted grating for a Long-Range Interferometric Gapping mark according to the concepts of the present invention.
Figure 11:
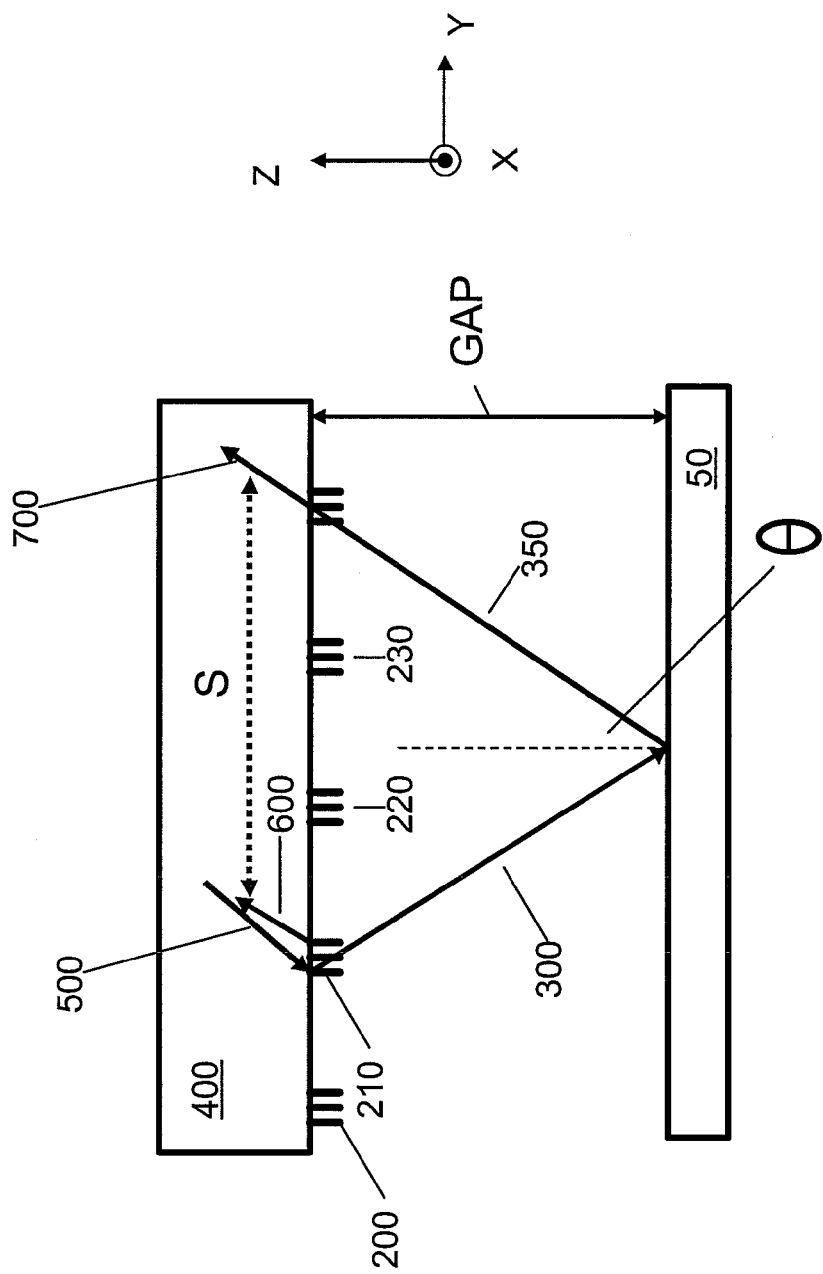
FIG. 11 illustrates a side-view of beam paths for various beams interacting with an interrupted grating.

FIGS. 10 and 11 illustrate the interrupted grating and the configuration of the diffracted beams, respectively.

As illustrated in FIG. 11, a mask 400 with a plurality of interrupted gratings (200, 210, 220, 230, and 240) is used to create an image upon the substrate 50. FIG. 11 further illustrates that a first set of beams 600 results from Littrow-type back-diffraction from narrow grating strips 210, and a second set of beams 700 results from reflection from the substrate 50 of forward diffracted beams (500, 300, and 350). The separation S for a given pair of beams is given by S=2Gsinθ wherein G is the distance between the mask 400 and the substrate 50 and θ is the angle of reflection, with respect to the substrate 50, of the forward-diffracted beam.

The spatial phase between back-diffracted beams 600 and reflected beams 700 unambiguously indicates the gap, providing a gap sensitivity of <~18 nm.

A phase relation between the two sets of diffracted beams is determined by taking the autopower spectrum of the overlapping sets of beams. The phase relation between the periodic intensity pattern resulting from the two sets of beams is indicated by the value of the phase at the fundamental spatial frequency of the intensity pattern.

The phase at double the fundamental spatial frequency yields a phase variation that changes at twice the rate of phase variation at the fundamental frequency. In practice, the intensity of a forward diffracted and reflected beam is lower than a direct back-diffracted beam due to scattering upon reflection.

A phase offset is introduced by the unequal spectral power at each spatial frequency. This phase offset is corrected by a calibrating adjustment based on the relative amplitude of the two types of diffracted beams and measurement of the phase relation at both the fringe fundamental and doubling frequencies. If a gap variation causes traversal of the diffracted intensity pattern by more than one period, absolute gap is determined with a simple peak-counting algorithm. Sensitivity to gap is <1/4000 of the spatial period or separation between the grating interruptions. More specifically, a spatial period of the interruptions in the grating of 100 μm can yield 18 nm sensitivity to gap, about an order of magnitude more sensitive than the phase ambiguity of Long-Range Interferometric Gapping marks and remove the phase ambiguity.

In another embodiment, the unambiguous measurement range can be extended by using another pair of gratings with different grating periods. A phase relation is detected between the first and second Long-Range Interferometric Gapping marks. Since the phase relation between the two Long-Range Interferometric Gapping marks of different periods will also be periodic, the range over which gap is unambiguously detected in this manner depends upon the relation of the grating periods in the first and second Long-Range Interferometric Gapping marks. The remaining phase ambiguity can be removed with additional Long-Range Interferometric Gapping marks having other periods.

Alternately, a single, narrow grating component can be used, consisting of a few grating lines (i.e., one segment of an interrupted grating), with the gap directly corresponding to the spatial separation between back-diffracted and forward diffracted/reflected beams. Gap sensitivity is based on a conventional peak-separation algorithm, with the coarse gap estimation accuracy corresponding to <1 μm, which is sufficient to resolve the phase ambiguity remaining with first and second Long-Range Interferometric Gapping marks with differing grating periods.

It is noted that the present invention can be used in conjunction with Transverse Chirped Gapping, which is designed to detect small gaps (a few 10s of μm to <1 μm gap) with interferometric sensitivity (<1 nm). An example of Transverse Chirped Gapping is described in U.S. Pat. No. 6,522,411. The present invention increases the range of Transverse Chirped Gapping over which the gap is detected interferometrically by more than an order of magnitude.

Typically, Transverse Chirped Gapping uses a varying, or chirped, periodicity in the pattern that allows gap detection from a 30 μm gap, down to <1 μm. The chirp rate of the grating can be varied for a larger or smaller range, with an inverse relationship to the sensitivity. The spatial frequency of the Transverse Chirped Gapping fringe pattern varies with the gap: at small gaps the spatial frequency is small, and increases with gap. At gaps beyond ~30 μm, using typical chirp rates, the spatial frequency approaches the resolution limit of the microscopes. The present invention may be utilized for gaps of ~30 μm to >500 μm.

As previously mentioned, the present invention can be used in conjunction with Interferometric Spatial-Phase Imaging which is designed to detect lateral (X, Y, and rotation) with interferometric sensitivity (<1 nm). Examples of Interferometric Spatial-Phase Imaging are described in U.S. Pat. Nos. 5,414,514 and 6,088,103.

Interferometric Spatial-Phase Imaging requires $P_1$ and $P_2$ period gratings on one planar surface and checkerboard-type gratings on the other planar surface. Since Interferometric Spatial-Phase Imaging also encodes position in the spatial phase relation of matched interference fringes, the detection of position is not constrained to operate only at small gaps, but can operate over a range of gaps, as constrained by the overlap of diffracted orders from a first grating on one surface with a second grating on the other surface.

Like the fringes produced by the present invention, the Interferometric Spatial-Phase Imaging fringes are visible over a focal range of several millimeters, permitting significant flexibility in the positioning of the optical microscope. The combination of the Interferometric Spatial-Phase Imaging fringes with the fringes produced by the present invention allows detection of one lateral axis (X or Y) and the vertical axis (Z) simultaneously in a single microscope's field of view. Three microscopes are required to detect position in six degrees of freedom. Since the microscopes are at an inclined illumination and observation angle, the three microscopes allow exposure, such as ultraviolet radiation, to continue without impediment from alignment and gap measurements. Six-axis position can therefore be adjusted continuously before and during exposure.

In summary, the present invention measures gap, using the spatial phase relation between sets of interference fringes produced by constant-period gratings on one of two substantially parallel plates, with nanometer sensitivity to gap over a wide range of gaps, including gaps of hundreds of microns, or several millimeters. Moreover, the gap detectivity of the present invention is independent of alignment, and the gap sensitivity is not constrained by the focal depth of the observing microscope. The present invention is also compatible with Interferometric Spatial-Phase Imaging alignment and Transverse-Chirp Gapping.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A gapping mark used for measuring a gap between first and second plates, comprising:
   a first grating on a first surface of a first plate, said first grating having a first uniform period in a first direction;
   a second grating on the first surface of the first plate, said second grating being adjacent to said first grating in said first direction, said second grating having a second uniform period in said first direction;
   a third grating on the first surface of the first plate, said third grating being adjacent to said first grating in a second direction, said second direction being substantially orthogonal to said first direction, said third grating having said second uniform period in said first direction; and a fourth grating on the first surface of the first plate, said fourth grating being adjacent to said third grating in said first direction, said fourth grating having said first uniform period in said first direction.

2. An apparatus for measuring a gap between first and second plates, comprising:

a first plate;

a second plate;

said first plate having a gapping mark on a first surface of said first plate;

said gapping mark including, a first grating on said first surface of said first plate, said first grating having a first uniform period in a first direction, a second grating on said first surface of said first plate, said second grating being adjacent to said first grating in said first direction, said second grating having a second uniform period in said first direction, a third grating on said first surface of said first plate, said third grating being adjacent to said first grating in a second direction, said second direction being substantially orthogonal to said first direction, said third grating having said second uniform period in said first direction, and a fourth grating on said first surface of said first plate, said fourth grating being adjacent to said third grating in said first direction, said fourth grating having said first uniform period in said first direction;

a light source for illuminating a second surface of said second plate through said gapping mark on said first plate to produce an interference pattern; and a detector to measure spatial phases of said interference pattern, the spatial phases of said interference pattern corresponding to a gap between the first and second surfaces of said first and second plates.

3. The apparatus as claimed in claim 2, wherein said first plate includes an interrupted grating on said first surface of said first plate, said interrupted grating being adjacent said gapping mark.

4. A lithographic mask, comprising:

a gapping mark on a first surface of the lithographic mask;

said gapping mark including, a first grating on the first surface of the lithographic mask, said first grating having a first uniform period in a first direction, a second grating on the first surface of the lithographic mask, said second grating being adjacent to said first grating in said first direction, said second grating having a second uniform period in said first direction, a third grating on the first surface of the lithographic mask, said third grating being adjacent to said first grating in a second direction, said second direction being substantially orthogonal to said first direction, said third grating having said second uniform period in said first direction, and a fourth grating on the first surface of the lithographic mask, said fourth grating being adjacent to said third grating in said first direction, said fourth grating having said first uniform period in said first direction.

5. The lithographic mask as claimed in claim 4, further comprising:

an interrupted grating on the first surface of the lithographic mask, said interrupted grating being adjacent said gapping mark.

6. A method of measuring the gap between first and second plates, comprising:

(a) providing a gapping mark on a first surface of the first plate, the gapping mark including a first grating on the first surface of the first plate, the first grating having a first uniform period in a first direction, a second grating on the first surface of the first plate, the second grating being adjacent to the first grating in the first direction, the second grating having a second uniform period in the first direction, a third grating on the first surface of the first plate, the third grating being adjacent to the first grating in a second direction, the second direction being substantially orthogonal to the first direction, the third grating having the second uniform period in the first direction, and a fourth grating on the first surface of the first plate, the fourth grating being adjacent to the third grating in the first direction;

(b) illuminating a second surface of the second plate through the gapping mark on the first plate to produce an interference pattern;

(c) measuring a phase of the interference pattern; and (d) determining a gap between the first and second surfaces from the measured phase of the interference pattern.

7. The method as claimed in claim 6, further comprising:

(e) providing an interrupted grating on the first surface of the first plate, the interrupted grating being adjacent the gapping mark.

* * * * *